United States Patent
Dubs

(10) Patent No.: US 6,692,618 B2
(45) Date of Patent: Feb. 17, 2004

(54) MAGNETRON SPUTTER SOURCE WITH MULTIPART TARGET

(75) Inventor: Martin Dubs, Trubbach (CH)

(73) Assignee: Unaxis Balzers Limited, Furstentum (LI)

(*) Notice: Subject to any disclaimer, the term of this patent is extended or adjusted under 35 U.S.C. 154(b) by 0 days.

(21) Appl. No.: 10/134,915

(22) Filed: Apr. 29, 2002

(65) Prior Publication Data

US 2002/0162737 A1 Nov. 7, 2002

(30) Foreign Application Priority Data

May 3, 2001 (CH) .............................................. 0804/01

(51) Int. Cl.$^7$ ............................................. C23C 14/35
(52) U.S. Cl. .......................... 204/192.12; 204/298.16; 204/298.08; 204/298.2; 204/298.28
(58) Field of Search ...................... 204/192.12, 192.13, 204/298.16, 298.12, 298.03, 298.08, 298.2, 298.23, 298.28

(56) References Cited

U.S. PATENT DOCUMENTS

| | | | |
|---|---|---|---|
| 4,505,789 A | 3/1985 | Ford | 204/128 |
| 4,622,121 A | 11/1986 | Wegmann et al. | 204/298 |
| 5,512,150 A | 4/1996 | Bourez et al. | 204/192.2 |
| 6,143,149 A | 11/2000 | Abe | 204/298.26 |
| 6,413,382 B1 * | 7/2002 | Wang et al. | 204/192.12 |
| 6,506,290 B1 * | 1/2003 | Ono | 204/298.11 |
| 2002/0029959 A1 | 3/2002 | Yo et al. | 204/192.12 |

* cited by examiner

Primary Examiner—Steve H. Ver Steeg
(74) Attorney, Agent, or Firm—Notaro & Michalos P.C.

(57) ABSTRACT

A device and method has a magnetron sputter source with a multipart target (3, 4) and movable magnet system (5). By variation of the power delivery of the power supply (6), specific areas of the multipart target (3, 4) can be preferably affected, which permits setting the stoichiometry of the sputtered-off target materials on the substrate (15) to be covered and positively affecting the homogeneity of the layer structure.

20 Claims, 1 Drawing Sheet

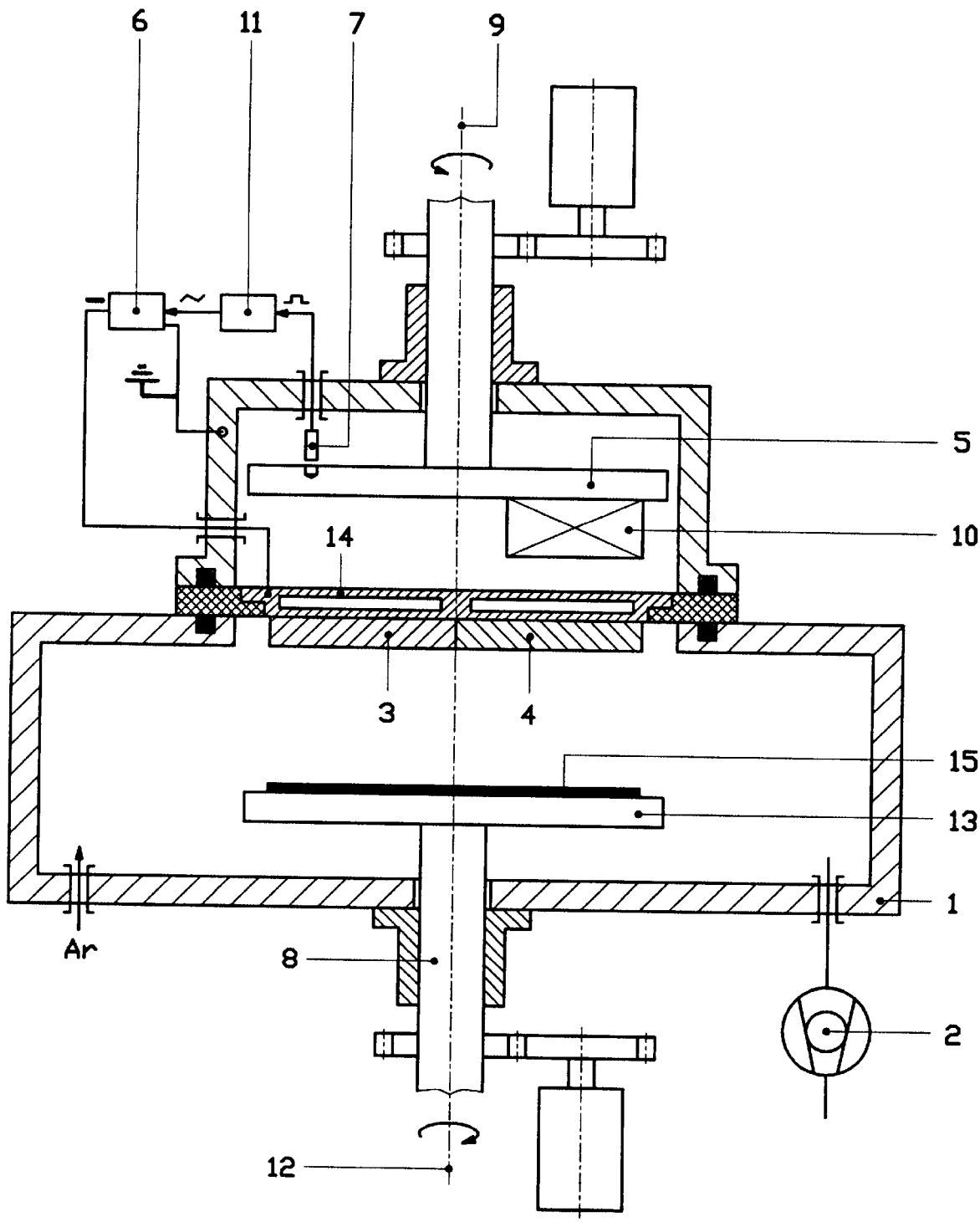

MAGNETRON SPUTTER SOURCE WITH MULTIPART TARGET

FIELD AND BACKGROUND OF THE INVENTION

The present invention relates to a method for operating a magnetron sputter source as well as a device for such.

Magnetron sputter sources are employed in vacuum coating devices for coating substrates in varied ways. As is well known by a person with ordinary skill in the art, that such a magnetron sputter source essentially comprises a target to be sputtered off and a magnet system, disposed behind it, which concentrates a plasma generated during operation in the proximity of the target surface in the form of a closed plasma tube, in order to intensify the sputtering of the material from the target.

A multiplicity of configurations and special adaptations have been developed in order to do justice to the broad spectrum of applications for this type of equipment. One of these areas is called cosputtering, in which several targets of differing materials are employed or a single target which is not comprised of a block of a single material or a material mixture, but rather is composed of differing elements in differing geometries (multipart or segmented target). With these types of targets, for example, layer sequences of different materials can be obtained, but, in addition, the capability is also given of affecting the composition of the layer to be applied during the sputtering process.

It is known that by using movable magnet systems in magnetron sputter sources, target utilization and layer thickness distribution can be affected generally.

Within the prior art several magnetron sputter sources and cosputter methods are known.

For example, the disposition of several simultaneously operated sputter sources opposite the substrate has been disclosed. By rotating the same, a layer-by-layer covering or an alloy coating becomes possible.

U.S. Pat. No. 4,505,798 describes the fundamental principle of a multipart target for differing target geometries (round, oblong, cylindrical). In particular, reference is made to the capability of determining the alloying rate of the layer to be sputtered on via the area ratio of the target segments.

U.S. Pat. No. 5,512,150 shows a configuration of concentric target rings above magnet systems to be definitively assigned in each instance to the target sections. The substrate, onto which the layers are applied, thereby appears to the target sections at different angles.

U.S. Pat. No. 6,143,149 describes a sputter device with multipart target in which each target segment is electrically insulated from the others and is individually connectable to a power supply. This target is provided with shielding sheets, which is intended to prevent the undesirable sputtering off of adjacent segments or their covering with impurity material.

All described cosputtering methods and devices with multipart targets have one disadvantage in common, which is that they insufficiently take into account the differing sputtering behavior of the materials. At constant sputter power certain regions of a multipart target are ablated more strongly than others. This impairs the service life of the target and the material yields. Attempts to compensate this through target profiling or different target thicknesses increase the expenditure in the target production. Furthermore, the configurations which allow influencing the layer composition during the sputtering process, could so far only be realized with large technical expenditures.

SUMMARY OF THE INVENTION

It is therefore the task of the present invention to eliminate the disadvantages of prior art and by employing the characteristics according to the invention to provide a sputter source, which has a simplified structure compared to prior known sputter sources, has increased economy and, moreover, permits variation of the alloy composition. In addition, high covering homogeneity of the substrate is to be ensured. The mechanical compatibility with known sputter systems with single-part, non-segmented targets is also possible.

The task is solved according to main features of the invention and further advantageous implementations according to the invention.

The operation of a magnetron sputter source with a multipart target, a movable magnet system and at least one power supply for plasma generation is distinguished thereby that power delivery of the at least one power supply is varied during operation.

If variation of the power delivery is synchronized, preferably synchronized under control and in particular periodically, with the movement of the magnet system, the coincidence of the pulverization region affected by the magnet system selectively with certain areas of the multipart target can be attained. It is thereby achieved that a certain power delivery of the power supply in each case acts upon a certain, preferably the same, segment of the target portion.

In a further preferred embodiment the variation of the power delivery for a power supply can be preset. In particular, the control, such as a computer control, permits the regulation according to presettable values.

Moreover, in a further embodiment at least one sensor is employed in the magnet system, which determines its position, for example with rotating systems the current position angle with respect to a reference point, and permits the synchronization of the power delivery of the power supply with the position of the magnet system.

The method according to the invention is preferably applied in configurations with round sources, with the magnet system rotating behind the target configuration. The target configuration is herein formed from the provided differing materials in multiple parts, at least in two parts, in particular with a round target configuration in segments. The substrate is disposed in front of the target at the conventional distance of a few cm, parallel or inclined to the target, and for homogenation of the layer application is preferably moved, in particular rotated. By utilizing the power variation according to the invention corresponding measures become possible for a person skilled in the art in order to obtain further effects. Thus, layer properties, which are a function of the covering rate per time (for example multiple layer), can be affected. Gradual changes of the composition can be attained by varying the power conditions during the sputtering off of differing target portions over the coating time period.

A magnetron sputter source according to the invention for coating substrates comprises a multipart target, a movable magnet system with driving for the affecting of the pulverization regions on the target and at least one power supply, as well as means for modulating the power delivery and further means for synchronization with the drive of the magnet system.

These means for modulating the power delivery can be realized with controls which permit setting, modulating or switching different power levels of one or several power supplies. Furthermore, through a control electronic circuitry a dynamic shape or a pulsing of the output power of one power supply can be realized. Embodiments as a separate control circuit of a DC or RF power supply or as a programmable power supply among other feasibilities are familiar to a person skilled in the art.

In a special embodiment the multipart target is structured circularly. This embodiment is of advantage for many applications in the semiconductor industry (wafer) or the production of storage media (CD, DVD, hard disks). In a further preferred embodiment the substrate is disposed such that it is movable, preferably rotatable about an axis substantially normal with respect to the substrate plane. Thereby the homogeneity of the layer application is improved. In particular, if, as in a further preferred embodiment, the movability of the magnet system is a rotatability about an axis substantially normal with respect to the target plane. Compared to other conceivable embodiments, this has the advantage that the magnet system remains equidistant from the target plane. Further advantages are attained through a motor drive of substrate and magnet system, preferably independently of one another. Due to the higher relative speed between substrate and the preferred pulverization regions (caused by the rotating magnet system), through opposite rotation a homogenization of the layer application on the substrate can be achieved.

In a further preferred embodiment means for determining the position of the magnet system are provided. This can take place through fixed assignment of the driving position or can be acquired with a sensor such as for example an angle sensor or a light barrier, which supplies a signal via an index hole in an also rotating disk.

A special effect is attained if the magnet system is not structured symmetrically with respect to an axis of rotation. The preferred pulverization region or the distribution of the pulverization particles on the substrate and the erosion profile on the target can be set. Through the rotation homogeneity of the pulverization is also ensured. The magnet system can simultaneously be produced to be more compact and thus more economical.

Further preferred embodiments relate to the type of target division. For a circular target, the execution of the segmenting into circle segments is advantageous along substantially radially extending joints. The advantages relate to production (for example cutting out from single-part targets) as well as also assembly. Target mount and cooling devices can be applied compatibly with devices known from prior art. In a further embodiment the target segments are composed according to the requirement of the target alloy from differing materials or material mixtures and according to known methods, for example fastened, for example by bonding, on a target rear plate. Alternatively, in a full target, recesses can be provided, into which segments of a further material can be set. Moreover, these segments can be available singly or multiply (for example two materials in four segments, each alternating).

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

The only FIGURE of the drawing depicts a system reduced to the components essential to the invention for coating a disk-shaped, rotating substrate with a multipart target.

DESCRIPTION OF THE PREFERRED EMBODIMENTS

In the following, the mechanism of action of the invention will be explained in conjunction with the FIGURE. A system for coating of storage disks, in particular optical storage disks, such as DVDs, and magneto-optical disks, will be discussed by way of example. The layers applied for the latter ones comprise for example transition metals (for example Fe, Co) and rare earths (Tb, Gd), which must be applied in a highly precise stoichiometry. For so-called "phase change disks", alloys with precise stoichiometry (for example of In, Ge, Sb, Ag) are also required.

A vacuum chamber 1 is evacuatable via a pumping device 2. On a target rear plate 14 two half-moon-shaped target segments 3 and 4 are disposed. Behind them, outside of the vacuum chamber 1, is disposed the magnet system 5, here with a magnet body 10 disposed asymmetrically with respect to the rotational target axis 9. The motor drive with respect to the axis 9 has been omitted. On the magnet system the sensor 7 is provided for the position determination, here in the form of a light barrier, which supplies a pulse to a control module 11. With the signal output by the control module the power supply 6 is subsequently modulated. A power or current modulation is preferably employed. Therewith the plasma density based on the position information of the magnet system is modulated in time. In the vacuum chamber 1 is disposed the substrate 5 on a substrate carrier 13. The motor drive with respect to the rotational substrate axis 12 is realized via the rotation throughguide 8 and is not shown here. Shown is a coaxial configuration of target and substrate 15. This permits a high transmission factor of the sputtered material from the target onto the substrate 15. Further configurations can be realized to attain special effects such as optimized edge covering, for example by development of an angle between target and substrate axis or, for increasing the throughput, by employing a planet system with several substrates.

During operation the position of the magnet system relative to the target configuration is determined by the sensor 7. This information is evaluated by the control module 11, which varies the power supply 6 accordingly in terms of its power delivery according to the presettings for the layer composition to be attained on the substrate 5. Guided by the magnet system, the magnetic field, which forms the electron trap, thus sweeps over the region of the preferred pulverization on target halves 3 and 4. Through the rotation of substrate 5 the covering is homogenized, both, in terms of composition as well as also distribution.

Through the disposition of the target rear plate 14 opposite the substrate 5, such that the axes 9 and 12 coincide, an ideal substrate covering with both materials is achieved. Movable diaphragms in the sputter volume with the hazard of particle formation and loss of sputter rate are avoided. The layer thickness distribution is highly similar for both materials, since the same geometric conditions (angle of incidence, distances) apply to both target sections. Thereby the constant stoichiometry over the substrate with high accuracy and reproducibility is ensured.

Compared to a commercial installation available on the market for magneto-optical coatings, the device according to the invention suffices with a minimum of additional parts. Essentially the control module 11, the multipart target and the sensor are required. As the power supply a commercially available apparatus can be used. Target change times and other maintenance works are also as short as in standard installations.

While a specific embodiment of the invention has been shown and described in detail to illustrate the application of the principles of the invention, it will be understood that the invention may be embodied otherwise without departing from such principles.

What is claimed is:

1. A method for operating a magnetron sputter source with a multipart target, a movable magnet system (5) and at least one power supply (6) for plasma generation, comprising the steps of delivering power from at least one power supply (6) that is varied during operation of the magnetron sputter source, the variation of the cower delivery being synchronized with the movement of the magnet system (5).

2. A method as claimed in claim 1, wherein means are provided for determining the position of the magnet system, whose information is used for the synchronization of the power delivery.

3. A method as claimed in claim 1, wherein the variation of the power delivery is synchronized with the movement of the magnet system (5) periodically.

4. A method as claimed in claim 1, wherein the power delivery is synchronized selectively with the coincidence of pulverization regions affected by the magnet system (5) with selected areas of the multipart target.

5. A method as claimed in claim 1, wherein the variation of the power delivery for the power supply (6) is preset.

6. A method as claimed in claim 5, wherein the variation of the power delivery for the power supply (6) is regulated through a control (11).

7. A method as claimed in claim 6, wherein the variation of the power delivery for the power supply (6) is regulated through a computer control and according to presettable values.

8. A method for operating a magnetron sputter source with a multipart target, a movable magnet system (5) and at least one power supply (6) for plasma generation, comprising the steps of delivering power from at least one power supply (6) that is varied during operation of the magnetron sputter source, and providing means for determining the position of the magnet system, whose information is used for the synchronization of the power delivery.

9. A magnetron sputter source for coating substrates (15) with a multipart target, comprising: a movable magnet system (5) with drive for affecting pulverization regions on the target, at least one power supply (6), the power supply (6) comprising further means for modulating power delivery with further means for synchronization with driving of the magnet system.

10. A magnetron sputter source as claimed in claim 9, wherein the multipart target is substantially circular.

11. A magnetron sputter source as claimed in claim 9, wherein the substrate (15) is disposed in front of the target such that the substrate is movable.

12. A magnetron sputter source as claimed in claim 9, wherein the substrate is rotatable about an axis (12) substantially normal with respect to the substrate plane.

13. A magnetron sputter source as claimed in claim 12, wherein the magnet system (5) and the substrate (15) are motor-drivable independently of one another.

14. A magnetron sputter source as claimed in claim 9, wherein the magnet system (5) is disposed such that it is rotatable about an axis (9) substantially normal with respect to the target plane.

15. A magnetron sputter source as claimed in claim 14, wherein the magnet system (5) is not structured symmetrically with respect to its rotational axis (9).

16. A magnetron sputter source as claimed in claim 9, wherein at least one sensor (7) is provided for determining the position of the magnet system (5).

17. A magnetron sputter source as claimed in claim 9, wherein segments of the target (3, 4) are implemented at least as two circle segments with substantially radially extending joints.

18. A magnetron sputter source as claimed in claim 9, wherein target segments (3, 4) of the target are comprised of different materials and/or alloys and/or material mixtures.

19. A magnetron sputter source as claimed in claim 9, wherein the power delivery is carried out through a single power supply (6).

20. A method for operating a magnetron sputter source with a multipart target, a movable magnet system (5) and at least one power supply (6) for plasma generation, comprising the steps of delivering power from at least one power supply (6) that is varied during operation of the magnetron sputter source, the power delivery being synchronized selectively with the coincidence of pulverization regions affected by the magnet system (5) with selected areas of the multipart target.

* * * * *